(12) United States Patent
Jain

(10) Patent No.: US 10,403,263 B1
(45) Date of Patent: Sep. 3, 2019

(54) SYSTEMS AND METHOD FOR NOISE-CANCELLATION

(71) Applicant: Bose Corporation, Framingham, MA (US)

(72) Inventor: Ankita D. Jain, Westborough, MA (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 16/220,780

(22) Filed: Dec. 14, 2018

(51) Int. Cl.
*H03B 29/00* (2006.01)
*G10K 11/178* (2006.01)
*G01R 23/02* (2006.01)

(52) U.S. Cl.
CPC ........ *G10K 11/17854* (2018.01); *G01R 23/02* (2013.01); *G10K 11/17813* (2018.01); *G10K 11/17855* (2018.01); *G10K 2210/3018* (2013.01); *G10K 2210/3025* (2013.01); *G10K 2210/3039* (2013.01); *G10K 2210/3226* (2013.01)

(58) Field of Classification Search
CPC ...................................................... H03B 29/00
See application file for complete search history.

(56) References Cited

U.S. PATENT DOCUMENTS

2014/0369511 A1* 12/2014 Sheerin ................ H04R 29/004
381/58

* cited by examiner

*Primary Examiner* — Olisa Anwah
(74) *Attorney, Agent, or Firm* — Bond, Schoeneck & King, PLLC

(57) ABSTRACT

A noise-cancellation system, including: a plurality of sensors, each sensor outputting a sensor signal; a controller configured to receive each sensor signal, and, for each sensor signal, to: determine a power of the sensor signal at a plurality of frequencies; determine a measure of association between the power of the sensor signal at the plurality of frequencies and frequency; and determine whether the measure of association exceeds a predetermined threshold, wherein the processor is further configured to compute a noise-cancellation signal using the sensor signals, wherein the noise-cancellation signal is computed excluding sensor signals that were determined to exceed the predetermined threshold; and at least one actuator receiving the noise-cancellation signal and producing a noise-cancellation audio signal.

20 Claims, 7 Drawing Sheets

SYSTEMS AND METHOD FOR NOISE-CANCELLATION

BACKGROUND

The present disclosure generally relates to systems and methods for noise-cancellation and for detecting a corrupted sensor signal in a noise-cancellation or noise-cancellation tuning system.

SUMMARY

All examples and features mentioned below can be combined in any technically possible way.

According to an aspect, a noise-cancellation system includes: a plurality of sensors, each sensor outputting a sensor signal; a controller configured to receive each sensor signal and, for each sensor signal, to: determine a power of the sensor signal at a plurality of frequencies; determine a measure of association between the power of the sensor signal at the plurality of frequencies and frequency; and determine whether the measure of association exceeds a predetermined threshold, wherein the controller is further configured to compute a noise-cancellation signal using the plurality of sensor signals, wherein the noise-cancellation signal is computed excluding sensor signals that were determined to exceed the predetermined threshold; and at least one actuator receiving the noise-cancellation signal and producing a noise-cancellation audio signal.

In an example, the measure of association is a measure of linear association, wherein the power of the sensor signal at the plurality of frequencies is measured in decibels, wherein frequency is logarithmic frequency.

In an example, the measure of linear association is determined using a correlation coefficient.

In an example, the correlation coefficient is a Pearson product-moment correlation coefficient.

In an example, the power of the sensor signal at the plurality of frequencies is a power spectral density.

In an example, the power spectral density is determined using Welch's method.

In an example, the controller is further configured to notify a user if a sensor signal of the plurality of sensor signals exceeds the predetermined threshold.

In an example, the controller is configured to notify the user which sensor of the plurality of sensors produced the sensor signal exceeding the predetermined threshold.

According to another aspect, a method for noise-cancellation includes: receiving a respective sensor signal from a plurality of sensors; determining, for each sensor signal, a power of the sensor signal at a plurality of frequencies; determining, for each sensor signal, a measure of association between the power of the sensor signal at the plurality of frequencies and frequency; and determining, for each sensor signal, whether the measure of association exceeds a predetermined threshold; computing a noise-cancellation signal using the plurality of sensor signals, wherein the noise-cancellation signal is computed excluding sensor signals that were determined to exceed the predetermined threshold; and providing the noise-cancellation signal to an actuator for transduction of a noise-cancellation audio signal.

In an example, the measure of association is a measure of linear association, wherein the power of the sensor signal at the plurality of frequencies is measured in decibels, wherein frequency is logarithmic frequency.

In an example, the measure of linear association is determined using a correlation coefficient.

In an example, the correlation coefficient is a Pearson product-moment correlation coefficient.

In an example, the power of the sensor signal at the plurality of frequencies is a power spectral density.

In an example, the power spectral density is determined using Welch's method.

In an example, the method further includes the steps of notifying a user if a sensor signal of the plurality of sensor signals exceeds the predetermined threshold.

In an example, notifying the user further comprises notifying the user which sensor of the plurality of sensors produced the sensor signal exceeding the predetermined threshold.

According to another aspect, a method for fault detection in a noise-cancellation system includes: receiving a sensor signal from a sensor, the sensor signal being used to generate a noise-cancellation signal or to tune the noise-cancellation system; determining a power of the sensor signal at a plurality of frequencies; determining a measure of association between the power of the sensor at the plurality of frequencies and frequency; and disengaging the sensor from the noise-cancellation system if the measure of association exceeds a predetermined threshold.

In an example, the measure of association is a measure of linear association, wherein the power of the sensor signal at the plurality of frequencies is measured in decibels, wherein frequency is logarithmic frequency.

In an example, the measure of linear association is determined using a correlation coefficient.

In an example, the method further includes the steps of notifying a user if a sensor signal of the plurality of sensor signals exceeds the predetermined threshold.

The details of one or more implementations are set forth in the accompanying drawings and the description below. Other features, objects, and advantages will be apparent from the description and the drawings, and from the claims.

DETAILED DESCRIPTION

Various examples described herein are directed to noise-cancellation systems and methods and noise-cancellation tuning systems and methods that detect corrupted sensor inputs. The outputs of sensors, such as accelerometers and microphones, used in noise-cancellation systems and noise-cancellation tuning systems, are often corrupted by sudden steps and drops that present as a "crackling" sound when played as audio. These sudden steps and drops typically result from loose wiring connections, although other causes are possible.

If a reference sensor (e.g., an accelerometer) output is corrupted in this manner, but the error microphone outputs are not corrupted, the performance of the adaptive noise-cancellation system will degrade significantly. Performance will similarly degrade if the error microphone outputs are corrupted, but the reference sensors are not corrupted. The performance degradation from corrupted sensor signals can occur either during pre-production (e.g., preparation of noise-cancellation system), production/development (e.g., tuning the noise-cancellation system), or post-production (e.g., maintaining a noise-cancellation system) stages. And it is thus beneficial to detect whether sensor outputs are corrupted during any of these stages.

The systems and methods described herein may be used, in various examples, by noise-cancellation systems and noise-cancellation tuning systems. An example noise-cancellation system and an example noise-cancellation tuning system will be briefly described, for purposes of illustration, in connection with FIGS. 1-3.

Figure 1:
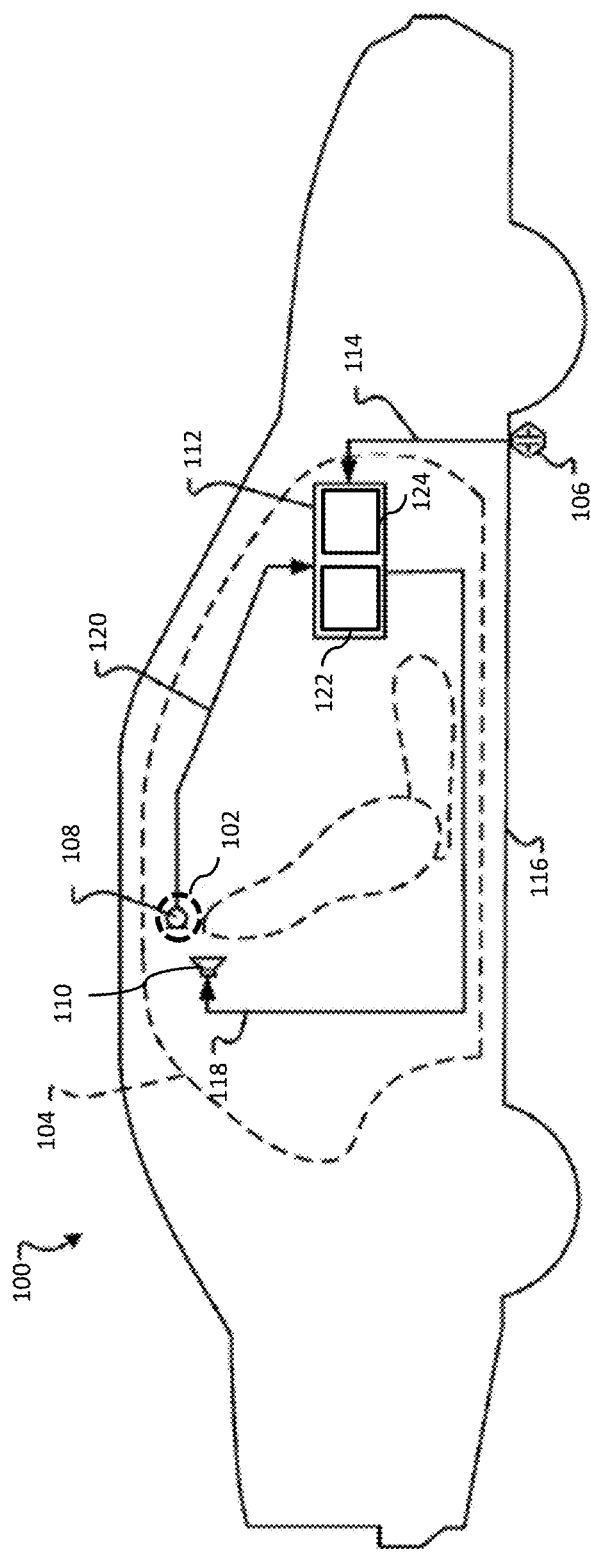
FIG. 1 depicts a schematic of a noise-cancellation system, according to an example.

FIG. 1 is a schematic view of an example noise-cancellation system 100. Noise-cancellation system 100 may be configured to destructively interfere with undesired sound in at least one cancellation zone 102 within a predefined volume 104 such as a vehicle cabin. At a high level, an example of noise-cancellation system 100 may include a reference sensor 106, an error sensor 108, an actuator 110, and a controller 112.

In an example, reference sensor 106 is configured to generate noise signal(s) 114 representative of the undesired sound, or a source of the undesired sound, within predefined volume 104. For example, as shown in FIG. 1, reference sensor 106 may be an accelerometer, or a plurality of accelerometers, mounted to and configured to detect vibrations transmitted through a vehicle structure 116. Vibrations transmitted through the vehicle structure 116 are transduced by the structure into undesired sound in the vehicle cabin (perceived as road noise), thus an accelerometer mounted to the structure provides a signal representative of the undesired sound Actuator 110 may, for example, be speakers distributed in discrete locations about the perimeter of the predefined volume. In an example, four or more speakers may be disposed within a vehicle cabin, each of the four speakers being located within a respective door of the vehicle and configured to project sound into the vehicle cabin. In alternate examples, speakers may be located within a headrest, or elsewhere in the vehicle cabin.

A noise-cancellation signal 118 may be generated by controller 112 and provided to one or more speakers in the predefined volume, which transduce the noise-cancellation signal 118 to acoustic energy (i.e., sound waves). The acoustic energy produced as a result of noise-cancellation signal 118 is approximately 180° out of phase with—and thus destructively interferes with—the undesired sound within the cancellation zone 102. The combination of sound waves generated from the noise-cancellation signal 118 and the undesired noise in the predefined volume results in cancellation of the undesired noise, as perceived by a listener in a cancellation zone.

Because noise-cancellation cannot be equal throughout the entire predefined volume, noise-cancellation system 100 is configured to create the greatest noise-cancellation within one or more predefined cancellation zones 102 with the predefined volume. The noise-cancellation within the cancellation zones may effect a reduction in undesired sound by approximately 3 dB or more (although in varying examples, different amounts of noise-cancellation may occur). Furthermore, the noise-cancellation may cancel sounds in a range of frequencies, such as frequencies less than approximately 350 Hz (although other ranges are possible).

Error sensor 108, disposed within the predefined volume, generates an error sensor signal 120 based on detection of residual noise resulting from the combination of the sound waves generated from the noise-cancellation signal 118 and the undesired sound in the cancellation zone. The error sensor signal 120 is provided to controller 112 as feedback, error sensor signal 120 representing residual noise uncancelled by the noise-cancellation signal. Error sensors 108 may be, for example, at least one microphone mounted within a vehicle cabin (e.g., in the roof, headrests, pillars, or elsewhere within the cabin).

It should be noted that the cancellation zone(s) may be positioned remotely from error sensor 108. In this case, the error sensor signal 120 may be filtered to represent an estimate of the residual noise in the cancellation zone(s). In either case, the error signal will be understood to represent residual undesired noise in the cancellation zone.

In an example, controller 112 may comprise a nontransitory storage medium 122 and processor 124. In an example, non-transitory storage medium 122 may store program code that, when executed by processor 124, implements the various filters and algorithms described below. Controller 112 may be implemented in hardware and/or software. For example, controller may be implemented by a SHARC floating-point DSP processor, but it should be understood that controller may be implemented by any other processor, FPGA, ASIC, or other suitable hardware.

Figure 2:
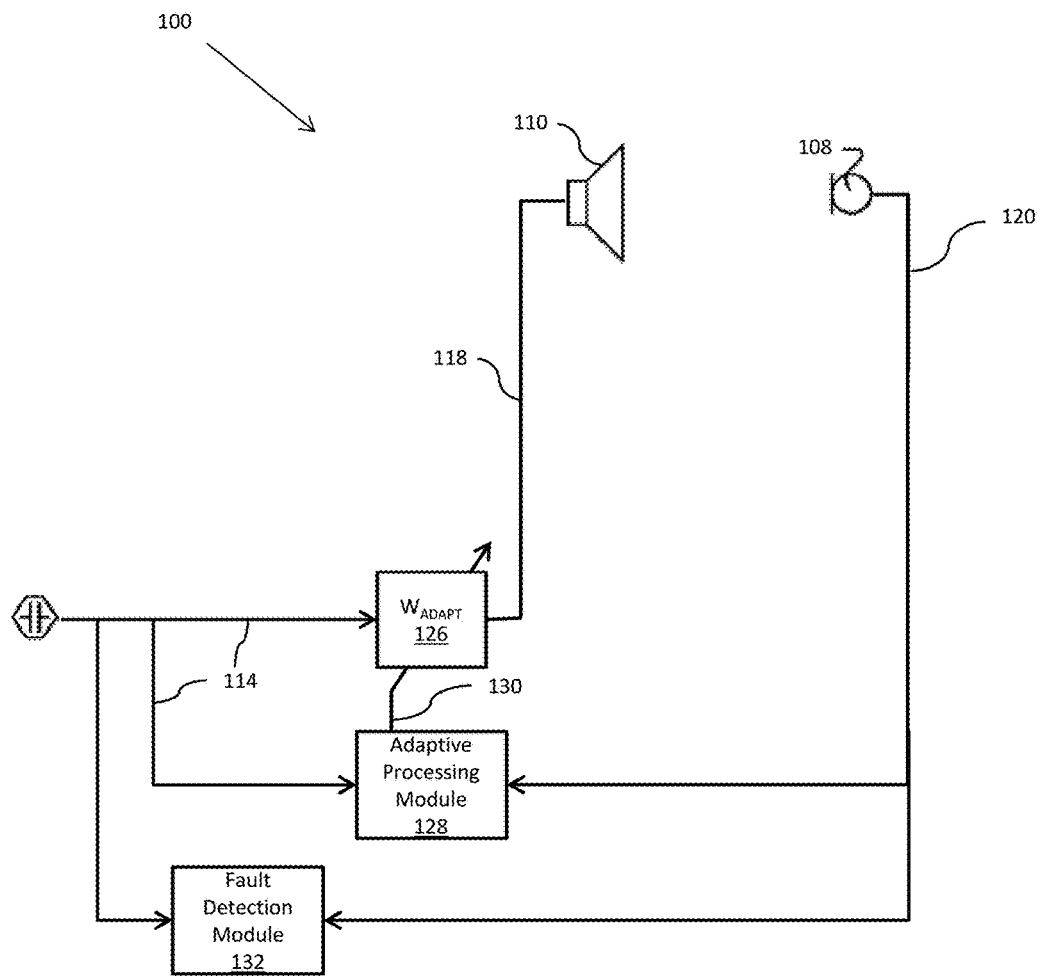
FIG. 2 depicts a block diagram of a noise-cancellation system, according to an example.

Turning to FIG. 2, there is shown a block diagram of an example of noise-cancellation system 100, including a plurality of filters implemented by controller 112. As shown, controller may define a control system including $W_{adapt}$ filter 126 and an adaptive processing module 128.

$W_{adapt}$ filter 126 is configured to receive the noise signal 114 of reference sensor 106 and to generate noise-cancellation signal 118. Noise-cancellation signal 118, as described above, is input to actuator 110 where it is transduced into the noise-cancellation audio signal that destructively interferes with the undesired sound in the predefined cancellation zone 102. $W_{adapt}$ filter 126 may be implemented as any suitable linear filter, such as a multi-input multi-output (MIMO) finite impulse response (FIR) filter. $W_{adapt}$ filter 126 employs a set of coefficients which define the noise-cancellation signal 118 and which may be adjusted to adapt to changing behavior of the nonlinear vehicle response to road input (or to other inputs in non-vehicular noise-cancellation contexts).

The adjustments to the coefficients may be performed by an adaptive processing module 128, which receives as inputs the error sensor signal 120 and the noise signal 114 and, using those inputs, generates a filter update signal 130. The filter update signal 130 is an update to the filter coefficients implemented in $W_{adapt}$ filter 126. The noise-cancellation signal 118 produced by the updated $W_{adapt}$ filter 126 will minimize error sensor signal 120, and, consequently, the undesired noise in the cancellation zone.

The coefficients of $W_{adapt}$ filter 126 at time step n may be updated according to the following equation:

$$W_{adapt}[n+1] = W_{adapt}[n] + \mu(\tilde{T}'_{de} * e)\frac{x}{\|x\|_2} \quad (1)$$

where $\hat{T}_{de}$ is an estimate of the physical transfer function between actuator 110 and the noise-cancellation zone 102, $\hat{T}'_{de}$ is the conjugate transpose of $\hat{T}_{de}$, e is the error signal, and x is the output signal of reference sensor 106. In the update equation, the output signal x of reference sensor is divided by the norm of x, represented as $\|x\|_2$.

Figure 5A:
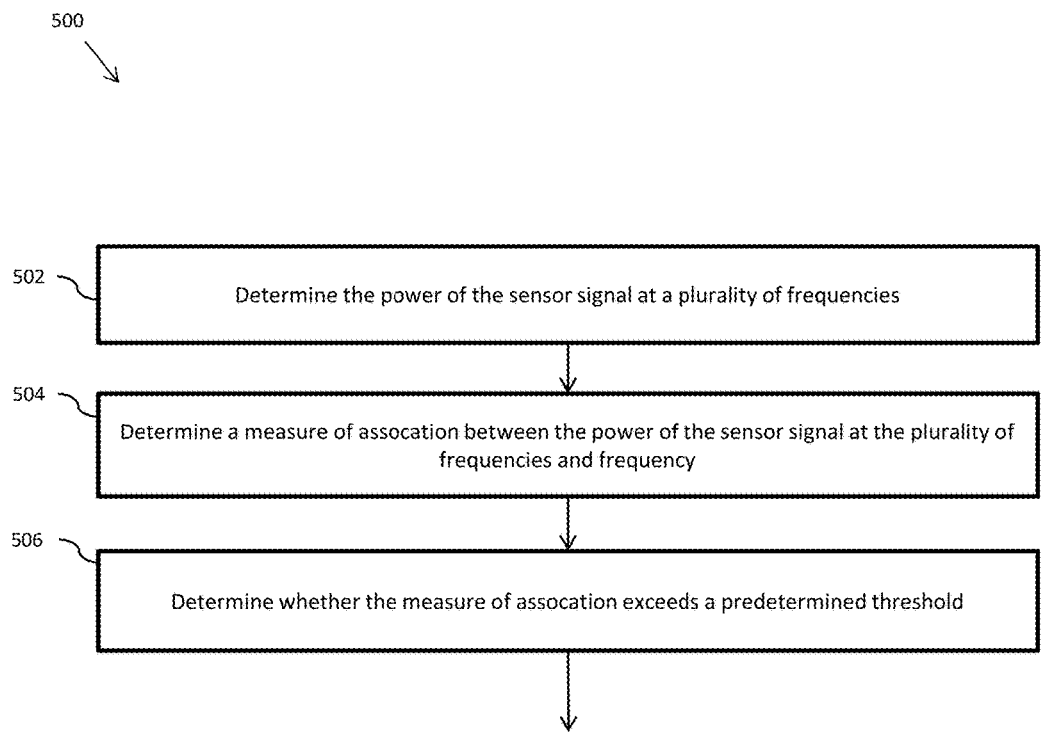
FIG. 5A is a method of detecting a corrupted sensor signal, according to an example.

Noise-cancellation system 100 further includes fault detection module, which is configured to receive noise signal 114 and error sensor signal 120, in order to determine whether the signals have been corrupted. This process is described in further detail below in and in connection with FIGS. 5A, 5B, and 5D.

The noise-cancellation system 100 of FIGS. 1 and 2 is merely provided as an example of such a system. It should be understood that this system, variants of this system, and other suitable noise-cancellation systems may be used within the scope of this disclosure.

Figure 3:
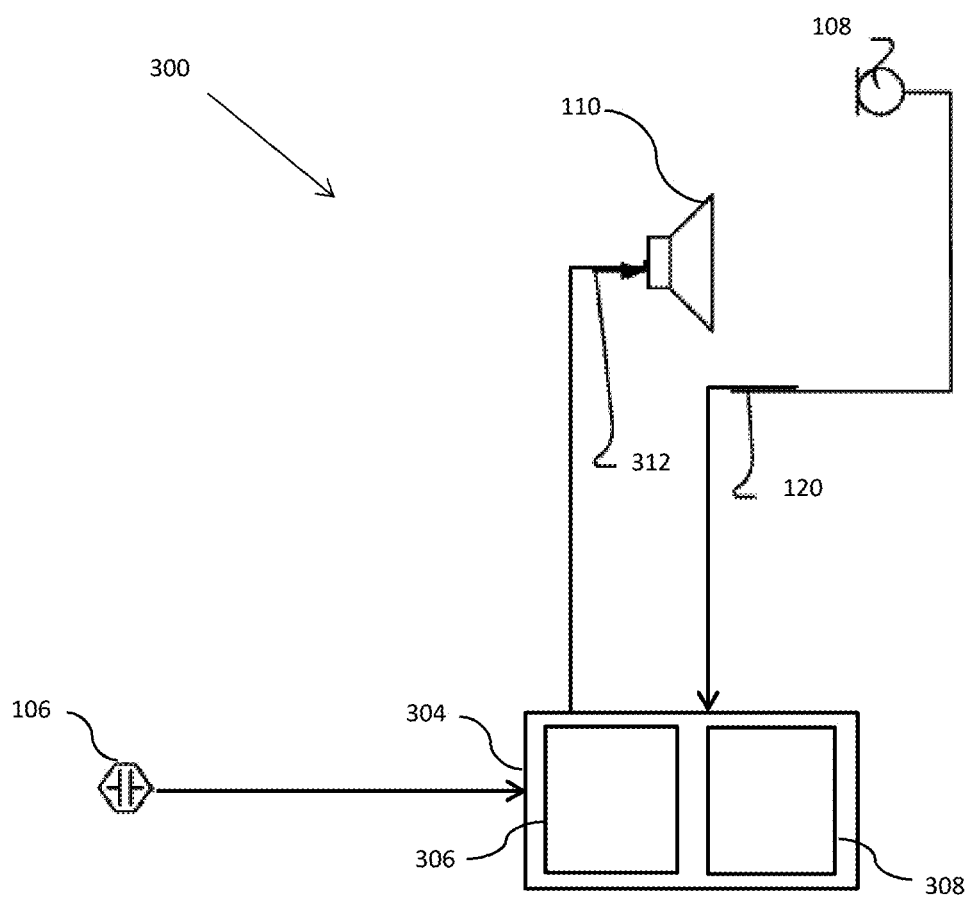
FIG. 3 depicts a schematic of a noise-cancellation tuning system, according to an example.

FIG. 3 depicts a noise-cancellation tuning system 300 for tuning a noise-cancellation system, such as noise-cancellation system 100, according to an example. As shown, noise-cancellation tuning system 300, similar to noise-cancellation system 100, includes reference sensor 106, actuator 110, and error sensor 108. Error sensor may be positioned in the desired location of the cancellation zone (e.g, at a passenger's ears). Tuning system 300 further includes controller 304. Controller 304 may include, for example, a non-transitory storage medium 306 suitable for storing program that, when executed by a processor 308, performs the tuning steps and the steps described below in conjunction with FIG. 5A, 5C, or 5D. In an example, controller 304 may generate a command signal 312 to be transduced into an audio signal at actuator 110 and controller 304 may receive a noise signal 114 from reference sensor 106 and an error sensor signal 120 from error sensor 108, and, using these inputs tune the adaptive filter of a noise-cancellation system. Controller 304 may be the same as controller 112 or may be implemented as a separate controller. In various examples, controller 304 may be implemented by a general process computer, an FPGA, an ASIC, or any other controller suitable for tuning the adaptive filter and for executing the steps described in connection with FIG. 5A, 5C, or 5D.

The noise-cancellation tuning system 300 of FIG. 3 is merely provided as an example of such a system. It should be understood that this system, variants of this system, and other suitable noise-cancellation tuning systems may be used within the scope of this disclosure.

Controllers 112, 304 may each be configured to (e.g., by fault detection module shown in FIG. 2) receive inputs from at least one sensor (e.g., reference sensor 106 or error sensor 108) and determine whether a given sensor signal is corrupted by determining whether a measure of association between the power of the sensor signal at plurality of frequencies and frequency exceeds a predetermined threshold.

During pre-production or production, a user may disengage any sensors outputting a sensor signal exceeding the predetermined threshold. Controller 112, 304 may further notify a user of any sensors outputting sensor signals exceeding the threshold, so that the sensor may be disengaged and replaced or repaired. Alternately, or in the same example, controller 304 may tune noise-cancellation system excluding any sensors exceeding the predetermined threshold.

Post-production, controller 112, having determined which sensor signals exceed the predetermined threshold, may, for example, calculate the noise-cancellation signal excluding the corrupted sensor signals. Alternately, or in addition, controller 112 may notify a user that the sensors outputting the corrupted sensor signal are in need of replacement or repair.

Figure 4A:
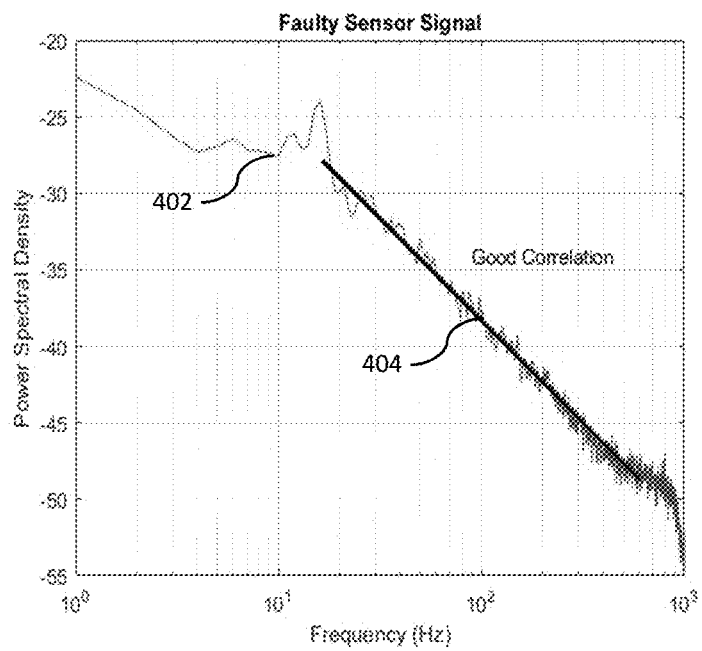
FIG. 4A is a graph depicting an example power output of a corrupted sensor signal across frequency.
Figure 4B:
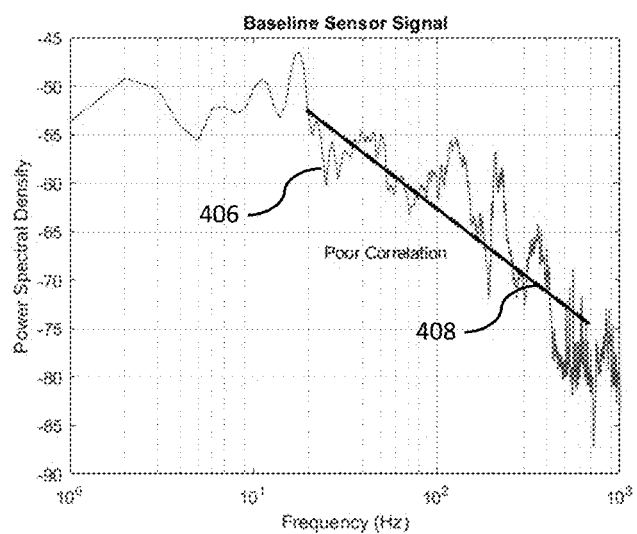
FIG. 4B is a graph depicting an example power output of an uncorrupted sensor signal across frequency.

The measure of association may, for example, determine a measure of linear association between the power in decibels of the sensor at a plurality of frequencies and frequency on a logarithmic scale. Sensor signals that are corrupted are typically dominated by the power of the sudden jumps and drops, which tends to present linearly when viewed in decibels and over frequency on a logarithmic scale. The power of sensor signals that are not corrupted are determined by the sensor inputs (e.g., vibrations or sounds) and thus, when viewed over the same scale, do not typical fall into a predictable linear pattern, but rather reflect the unpredictable environmental input. An example of this may be seen in FIGS. 4A and 4B. In FIG. 4A the power in decibels of an example corrupted sensor signal over logarithmic frequency and compared against a straight line. Similarly, FIG. 4B depicts the power in decibels of an example uncorrupted sensor signal over logarithmic frequency and compared to a straight line. Contrasting FIG. 4A with FIG. 4B, it may be easily observed that the power of the corrupted signal fits a straight line better than the power of the uncorrupted signal.

Thus, a measure of how closely the power of the output signal falls on a straight line when measured in decibels over logarithmic frequency will correlate to the likelihood that the signal is corrupted. In other words, if the power in decibels falls closely to a linear function over logarithmic frequency, it is likely that the signal is corrupted. Conversely, if the power in decibels does not fall closely to a linear function over logarithmic frequency, it is unlikely that the signal is corrupted. It should be understood that the slope of the linear function is irrelevant to this determination, only the goodness of fit to a line of best fit matters.

As described above, the measure of association may be compared against a threshold, the value of which may be determined according the demands of the context in which it is used. The threshold may be tailored by weighing the need to determine whether a signal is corrupted against the risk of a falsely identifying a signal as corrupted when it is not. The weight of these factors will be context-specific and it will be understood that the actual value of the threshold will depend on the method of determining the measure of association.

It should also be understood that determining the measure of association as closeness of fit to a linear function is only one way to determine the measure of association. The measure of association may be alternately determined, for example, by calculating the closeness of fit to a curve designed to match the characteristics of an uncorrupted sensor over non-logarithmic frequency.

FIG. 5 depicts a method 500 for detecting a corrupted sensor signal. Method 500 may be performed by a controller such as a controller 112 in noise-cancellation system 100 or controller 304 in noise-cancellation tuning system 300. This method may be performed for a plurality of sensor signals (e.g., reference sensor 106 or error sensor 108) received from a plurality of sensors used in noise-cancellation system, such as noise-cancellation system 100, or a noise-cancellation tuning system, such as noise-cancellation tuning system 300.

At step 502, a power of the sensor signal is determined at a plurality of frequencies. The power of the sensor signal over a set of frequencies may be calculated by determining the power spectral density of the sensor signal as a function of frequency. The power spectral density may be calculated in any number of suitable ways, including using periodogram spectrum estimates, Bartlett's method, or Welch's method. In the latter case, using Welch's method, the N-point power spectral density (PSD) at a frequency bin k for a time series, averaged over M frames with 50% or N/2 overlap, may be given by:

$$S_{aa}[k] = \frac{1}{M} \sum_{m=0}^{M-1} \left| \sum_{n=1}^{N} a\left[n + \frac{N}{2}m\right] e^{-j2\pi \frac{kn}{N}} \right|^2 \quad (2)$$

Or expressed using a mean of the magnitude square of the N-point Fast Fourier Transform (FFT) of the time series computed across adjacent frames with N/2 overlap as:

$$S_{aa}[k] = \frac{1}{M} \sum_{m=0}^{M-1} \left| FFT_N\left(a\left[1 + \frac{N}{2}m : N + \frac{N}{2}m\right]\right) \right|^2 \quad (3)$$

The frequency vector, assuming a K-point FFT, is given by:

$$f[k] = \frac{k}{K} F_S \quad (4)$$

where $F_s$ is the sampling frequency. For real signals in the time domain, the first $$\frac{K}{2} + 1$$

signals of the power spectral density are enough to characterize the signal in the frequency domain.

The above methods of calculating the power of the sensor signal at a plurality of frequency are merely provided as examples and any suitable method for calculating the power of the sensor signal at a plurality of frequencies may be used.

At step 504, a measure of association between the power of the sensor signal at the plurality of frequencies (determined in step 502) and frequency is determined. The measure of association between the power of the sensor signal at the plurality of frequencies and frequency may be calculated by determining the goodness of fit to a line of best fit between the power in decibels of the sensor signal at a plurality of frequencies and logarithmic frequency. In an example, this may be determined by computing the magnitude of the correlation coefficients between the power spectral density (e.g., as described above) in decibels and the corresponding frequency vector on a logarithmic scale over a frequency range of interest, according to the following equation:

$$\rho_{S_{aa},f} = \left| \frac{\text{cov}(10\log_{10} S_{aa}[k_{refs}], 10\log_{10} f[k_{refs}])}{\sigma_{10\log_{10} S_{aa}[k_{refs}]}, \sigma_{10\log_{10} f[k_{refs}]}} \right| \quad (5)$$

where $k_{refs}$ is the frequency range of interest. The above equation represents the magnitude of the Pearson product-moment correlation coefficient, which yields an output ranging from 0 (no linear correlation) to 1 (total linear correlation). The frequency range of interest, may, for example, be the frequency range over which corrupted sensor signals most reliably display linear behavior (over a logarithmic scale). In an example, the frequency range of interest may be, for example, between 10 Hz and 1 kHz, although other ranges may be used.

It should be understood that the above method of determining the association is only one method of determining a linear association. Indeed, any suitable method determining goodness of fit to a line of best fit may be used. Furthermore, as mentioned above, it should be understood that the association need not be a method of determining a linear association, but rather some other method of determining an association between power and frequency that yields a results correlating to a corrupted sensor signal may be used. For example, as described above, the measure of association may be determined by calculating the closeness of fit to a curve designed to match the characteristics of an uncorrupted sensor over non-logarithmic frequency.

Figure 6:
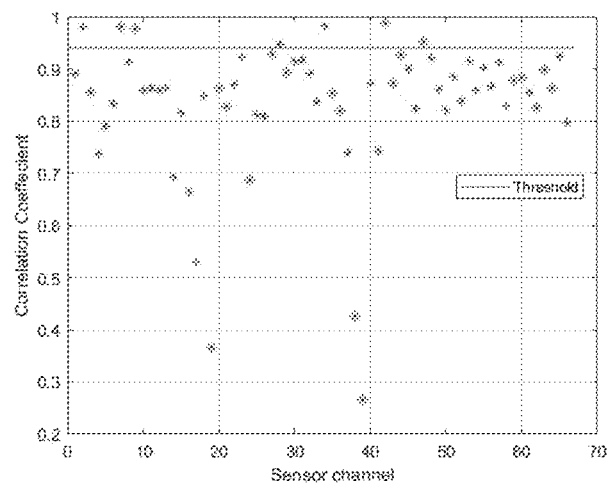
FIG. 6 is a graph of a set of example correlation coefficient values of a plurality of sensor channels.

At step 506, the measure of association (determined in step 504) is compared to a threshold to determine whether the measure of association exceeds the threshold. The threshold may be calculated to minimize the risk of a false determination of a corrupted sensor signal against the need to determine signals are corrupted. In the above example using the Pearson product-moment correlation coefficient a measure of association above 0.95 was shown to reliably detect corrupt sensor signals. FIG. 6 depicts a graph of the correlation coefficient value of approximately 70 sensor channels measured against a 0.95 correlation coefficient threshold to determine which sensors are corrupted, yielding seven identified corrupt signals. Again, the value 0.95 is merely provided as an example. The nature of the context in which the method 500 is used, and the method of determining the measure of association may determine the value of the selected threshold.

Figure 5B:
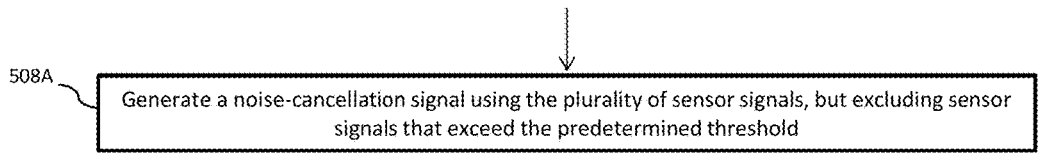
FIG. 5B is a method of generating a noise-cancellation signal, according to an example.
Figure 5C:
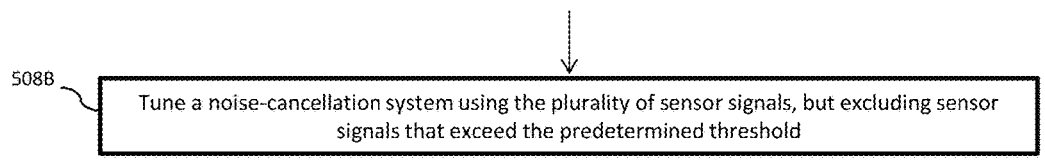
FIG. 5C is a method of tuning a noise-cancellation system, according to an example.
Figure 5D:
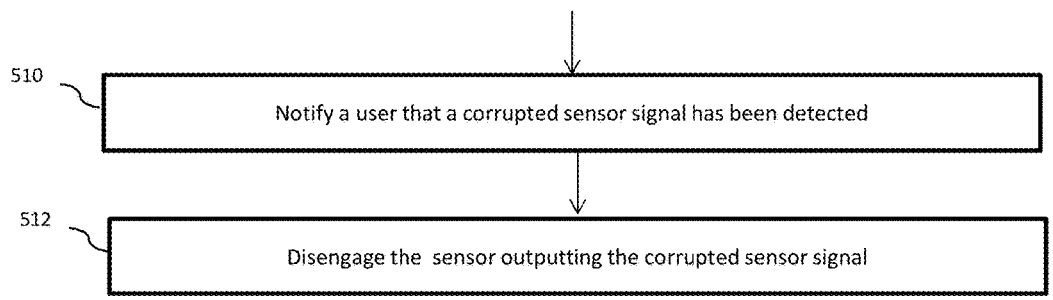
FIG. 5D is a method of notifying a user of and disengaging a corrupted sensor, according to an example.

FIGS. 5B-5D depicts methods of various systems using the detected corrupted signals of method 500.

Step 508A of FIG. 5B, which may be performed by a noise-cancellation system (such as noise-cancellation system 100) post-production may generate a noise-cancellation signal using the plurality of sensor signals, but excluding sensor signals that exceed the predetermined threshold so that the corrupted sensor signals do not interfere with noise-cancellation. In this context, the threshold may be set low enough (e.g., lower than a 0.95 correlation coefficient) to detect corrupted sensor signals before they affect the performance of the noise-cancellation system. In another example, however, a more conservative threshold may be set, even if it is high enough that a degradation of the noise-cancellation system is perceptible.

Step 508B of FIG. 5C, which may be performed during production by a noise-cancellation tuning system, such as noise-cancellation tuning system 300, may tune a noise-cancellation system (such as noise-cancellation system 100) using the plurality of sensor signals, but excluding sensor signals that exceed the predetermined threshold. In this example, it is generally most useful to select a threshold that reliably detects corrupted sensor signals (e.g., a 0.95 correlation coefficient); however, it should be understood that other thresholds may be selected according to the system used and requirements of the particular context.

The steps of FIG. 5D may be performed either by a noise-cancellation system (e.g., noise-cancellation system 100) or by a noise-cancellation tuning system (e.g., noise-cancellation tuning system 300), during pre-production, production, or post-production. The steps of FIG. 5D may occur in addition to or instead of the steps described in connection with FIGS. 5B and 5C.

At step 510, a user (e.g., a technician or consumer) may be notified that a corrupted sensor signal has been detected. This step may comprise notifying the user of which sensor is outputting the corrupted sensor signal. This step may be performed by a controller (e.g., controller 112, 304) through a user interface, such as a screen.

At step 512, which may occur in addition to or in place of steps 508A or 508B, the sensor outputting the corrupted sensor signal may be disengaged in order to repair or replace the sensor. Disengaging the sensor may comprise manually removing and replacing or repairing the sensor. In an alternate example, instead of disengaging the sensor, the sensor may be repaired by tightening loose wiring or a loose connection causing the corrupted output.

The above systems and methods represent an improvement to the functioning of a computer by allowing a computer to detect the presence of a faulty sensor outputting a corrupted sensor signal, which computers were not previously able to do, using a method not previously implemented by humans.

The functionality described herein, or portions thereof, and its various modifications (hereinafter "the functions") can be implemented, at least in part, via a computer program product, e.g., a computer program tangibly embodied in an information carrier, such as one or more non-transitory machine-readable media or storage device, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the functions can be performed by one or more programmable processors executing one or more computer programs to perform the functions of the calibration process. All or part of the functions can be implemented as, special purpose logic circuitry, e.g., an FPGA and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Components of a computer include a processor for executing instructions and one or more memory devices for storing instructions and data.

While several inventive examples have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive examples described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive examples described herein. It is, therefore, to be understood that the foregoing examples are presented by way of example only and that, within the scope of the appended claims and equivalents thereto, inventive examples may be practiced otherwise than as specifically described and claimed. Inventive examples of the present disclosure are directed to each individual feature, system, article, material, and/or method described herein. In addition, any combination of two or more such features, systems, articles, materials, and/or methods, if such features, systems, articles, materials, and/or methods are not mutually inconsistent, is included within the inventive scope of the present disclosure.

What is claimed is:

1. A noise-cancellation system, comprising:
   a plurality of sensors, each sensor outputting a sensor signal;
   a controller configured to receive each sensor signal and, for each sensor signal, to:
     determine a power of the sensor signal at a plurality of frequencies;
     determine a measure of association between the power of the sensor signal at the plurality of frequencies and frequency; and
     determine whether the measure of association exceeds a predetermined threshold, wherein the controller is further configured to compute a noise-cancellation signal using the plurality of sensor signals, wherein the noise-cancellation signal is computed excluding sensor signals that were determined to exceed the predetermined threshold; and
   at least one actuator receiving the noise-cancellation signal and producing a noise-cancellation audio signal.

2. The noise-cancellation system of claim 1, wherein the measure of association is a measure of linear association, wherein the power of the sensor signal at the plurality of frequencies is measured in decibels, wherein frequency is logarithmic frequency.

3. The noise-cancellation system of claim 2, wherein the measure of linear association is determined using a correlation coefficient.

4. The noise-cancellation system of claim 3, wherein the correlation coefficient is a Pearson product-moment correlation coefficient.

5. The noise-cancellation system of claim 1, wherein the power of the sensor signal at the plurality of frequencies is a power spectral density.

6. The noise-cancellation system of claim 5, wherein the power spectral density is determined using Welch's method.

7. The noise-cancellation system of claim 1, wherein the controller is further configured to notify a user if a sensor signal of the plurality of sensor signals exceeds the predetermined threshold.

8. The noise-cancellation system of claim 7, wherein the controller is configured to notify the user which sensor of the plurality of sensors produced the sensor signal exceeding the predetermined threshold.

9. A method for noise-cancellation, comprising:
receiving a respective sensor signal from a plurality of sensors;
determining, for each sensor signal, a power of the sensor signal at a plurality of frequencies;
determining, for each sensor signal, a measure of association between the power of the sensor signal at the plurality of frequencies and frequency; and
determining, for each sensor signal, whether the measure of association exceeds a predetermined threshold;
computing a noise-cancellation signal using the plurality of sensor signals, wherein the noise-cancellation signal is computed excluding sensor signals that were determined to exceed the predetermined threshold; and
providing the noise-cancellation signal to an actuator for transduction of a noise-cancellation audio signal.

10. The method of claim 9, wherein the measure of association is a measure of linear association, wherein the power of the sensor signal at the plurality of frequencies is measured in decibels, wherein frequency is logarithmic frequency.

11. The method of claim 10, wherein the measure of linear association is determined using a correlation coefficient.

12. The method of claim 11, wherein the correlation coefficient is a Pearson product-moment correlation coefficient.

13. The method of claim 9, wherein the power of the sensor signal at the plurality of frequencies is a power spectral density.

14. The method of claim 13, wherein the power spectral density is determined using Welch's method.

15. The method of claim 9, further comprising the steps of notifying a user if a sensor signal of the plurality of sensor signals exceeds the predetermined threshold.

16. The method of claim 15, wherein notifying the user further comprises notifying the user which sensor of the plurality of sensors produced the sensor signal exceeding the predetermined threshold.

17. A method for fault detection in a noise-cancellation system, comprising:
receiving a sensor signal from a sensor, the sensor signal being used to generate a noise-cancellation signal or to tune the noise-cancellation system;
determining a power of the sensor signal at a plurality of frequencies;
determining a measure of association between the power of the sensor at the plurality of frequencies and frequency; and
disengaging the sensor from the noise-cancellation system if the measure of association exceeds a predetermined threshold.

18. The method of claim 17, wherein the measure of association is a measure of linear association, wherein the power of the sensor signal at the plurality of frequencies is measured in decibels, wherein frequency is logarithmic frequency.

19. The noise-cancellation system of claim 18, wherein the measure of linear association is determined using a correlation coefficient.

20. The method of claim 17, further comprising the steps of notifying a user if a sensor signal of the plurality of sensor signals exceeds the predetermined threshold.

* * * * *